United States Patent
Ranish

(10) Patent No.: US 10,486,183 B2
(45) Date of Patent: Nov. 26, 2019

(54) METHODS AND APPARATUS FOR DELIVERING PROCESS GASES TO A SUBSTRATE

(71) Applicant: APPLIED MATERIALS, INC., Santa Clara, CA (US)

(72) Inventor: Joseph M. Ranish, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 766 days.

(21) Appl. No.: 13/939,591

(22) Filed: Jul. 11, 2013

(65) Prior Publication Data
US 2014/0030433 A1   Jan. 30, 2014

Related U.S. Application Data

(60) Provisional application No. 61/676,403, filed on Jul. 27, 2012.

(51) Int. Cl.
*B05C 5/00*   (2006.01)
*C23C 16/24*   (2006.01)
(Continued)

(52) U.S. Cl.
CPC ............... *B05C 5/00* (2013.01); *B05C 5/001* (2013.01); *C23C 16/24* (2013.01); *C23C 16/455* (2013.01);
(Continued)

(58) Field of Classification Search
USPC ........................ 118/715; 156/345.33, 345.34
See application file for complete search history.

(56) References Cited

U.S. PATENT DOCUMENTS 5,445,699 A * 8/1995 Kamikawa ........ C23C 16/45589
                                                    118/715
5,728,253 A * 3/1998 Saito .................... B81C 1/00587
                                                    118/712
(Continued)

FOREIGN PATENT DOCUMENTS

CN        102051595 A        5/2011
CN        102485257 A        6/2012
(Continued)

OTHER PUBLICATIONS

International Search Report and Written Opinion dated Oct. 23, 2013 for PCT Application No. PCT/US2013/050092.
(Continued)

*Primary Examiner* — Kambiz Zand
*Assistant Examiner* — Mirza Israr Javed
(74) *Attorney, Agent, or Firm* — Moser Taboada; Alan Taboada

(57) ABSTRACT

Methods and apparatus for delivering process gases to a substrate are provided herein. In some embodiments, an apparatus for processing a substrate may include a gas distribution conduit disposed in a processing volume of a process chamber above a substrate support to distribute a process gas to a processing surface of the substrate when disposed on the substrate support; and an actuator coupled to the gas distribution conduit to move the gas distribution conduit with respect to the substrate support. In some embodiments, a method of processing a substrate may include introducing a process gas to a process chamber through a gas distribution conduit disposed above a substrate having a processing surface; and moving the gas distribution conduit within the process chamber and with respect to the substrate to distribute the process gas across the processing surface of the substrate.

19 Claims, 3 Drawing Sheets

(51) Int. Cl.
  *C30B 25/14* (2006.01)
  *C23C 16/455* (2006.01)
(52) U.S. Cl.
  CPC ........ *C23C 16/45578* (2013.01); *C30B 25/14* (2013.01)

(56) References Cited

U.S. PATENT DOCUMENTS

| | | | | |
|---|---|---|---|---|
| 6,499,425 | B1* | 12/2002 | Sandhu | ............ C23C 16/34 118/723 E |
| 6,527,865 | B1* | 3/2003 | Sajoto | ............ C23C 16/4401 118/715 |
| 2002/0029748 | A1 | 3/2002 | Kuwada et al. | |
| 2003/0024900 | A1 | 2/2003 | Johnson | |
| 2004/0082251 | A1* | 4/2004 | Bach | ............ C23C 16/45563 445/60 |
| 2005/0268856 | A1* | 12/2005 | Miller | ............ C23C 16/45544 118/729 |
| 2008/0066738 | A1* | 3/2008 | Landis | ............ F24J 2/05 126/704 |
| 2008/0092929 | A1 | 4/2008 | Yokouchi | |
| 2008/0127892 | A1* | 6/2008 | Kim | ............ C23C 16/045 118/712 |
| 2008/0276864 | A1 | 11/2008 | Koelmel et al. | |
| 2009/0205684 | A1* | 8/2009 | Orii | ............ H01L 21/02052 134/33 |
| 2010/0008656 | A1 | 1/2010 | Sorabji et al. | |
| 2010/0126418 | A1 | 5/2010 | Chiang et al. | |
| 2010/0267249 | A1 | 10/2010 | Kim et al. | |
| 2011/0135842 | A1* | 6/2011 | Faguet | ............ C23C 16/4401 427/569 |
| 2012/0027918 | A1* | 2/2012 | Tiner | ............ B05B 1/005 427/58 |
| 2012/0186521 | A1* | 7/2012 | Iwasaki | ............ C23C 16/45517 118/723 AN |
| 2013/0019803 | A1* | 1/2013 | Samir | ............ C23C 16/45578 118/725 |

FOREIGN PATENT DOCUMENTS

| | | |
|---|---|---|
| JP | 2004-111857 A | 4/2004 |
| JP | 2008-182131 A | 8/2008 |
| JP | 2012-084648 A | 4/2012 |
| KR | 10-2008-0019109 | 3/2008 |
| KR | 10-2009-0028223 | 3/2009 |

OTHER PUBLICATIONS

Search Report from the State Intellectual Property Office of the People's Republic of China dated Jul. 7, 2016 received for Chinese Application No. 2013800381844.

Search Report for Taiwan Invention Patent Application No. 102125247 dated Oct. 14, 2016.

Search Report received from the State Intellectual Property Office of the People's Republic of China for Chinese Application No. 2013800381844 dated Feb. 16, 2017.

* cited by examiner

METHODS AND APPARATUS FOR DELIVERING PROCESS GASES TO A SUBSTRATE

CROSS-REFERENCE TO RELATED APPLICATIONS

This application claims benefit of U.S. provisional patent application Ser. No. 61/676,403, filed Jul. 27, 2012, which is herein incorporated by reference in its entirety.

FIELD

Embodiments of the present invention generally relate to methods and apparatus for delivering process gases to a substrate.

BACKGROUND

As the critical dimensions of complementary metal oxide semiconductor (CMOS) devices continue to shrink, novel materials need to be incorporated into CMOS architecture, for example, to improve energy efficiency and/or speed. An exemplary but non-limiting group of such materials, which may be utilized, for example, in the channel of a transistor device, is III-V materials. Unfortunately, current processing apparatus and methods fail to yield films having suitable material quality, such as low defect density, composition control, high purity, morphology, in-wafer uniformity, and run to run reproducibility.

Accordingly, the present invention is directed to providing improved methods and apparatus for delivering process gases to a substrate.

SUMMARY

Methods and apparatus for delivering process gases to a substrate are provided herein. In some embodiments of the present invention, an apparatus for processing a substrate may include a gas distribution conduit disposed in a processing volume of a process chamber above a substrate support to distribute a process gas to a processing surface of a substrate when disposed on the substrate support; and an actuator coupled to the gas distribution conduit to move the gas distribution conduit with respect to the substrate support.

In some embodiments of the present invention, an apparatus for processing a substrate may include a process chamber having a substrate support; a heating system to provide heat energy to a substrate when disposed on the substrate support; a gas inlet port disposed to a first side of the substrate support to provide a first process gas across a processing surface of a substrate when disposed on the substrate support; a gas distribution conduit disposed in a processing volume of the process chamber above a substrate to distribute a second process gas to a processing surface of the substrate when disposed on the substrate support; an actuator coupled to the gas distribution conduit to move the gas distribution conduit with respect to the substrate support; and an exhaust manifold disposed to a second side of the substrate support opposite the gas inlet port to exhaust the process gases from the process chamber.

In some embodiments of the present invention, a method of processing a substrate may include introducing a process gas to a process chamber through a gas distribution conduit disposed above a substrate having a processing surface; and moving the gas distribution conduit within the process chamber and with respect to the substrate to distribute the process gas across the processing surface of the substrate.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
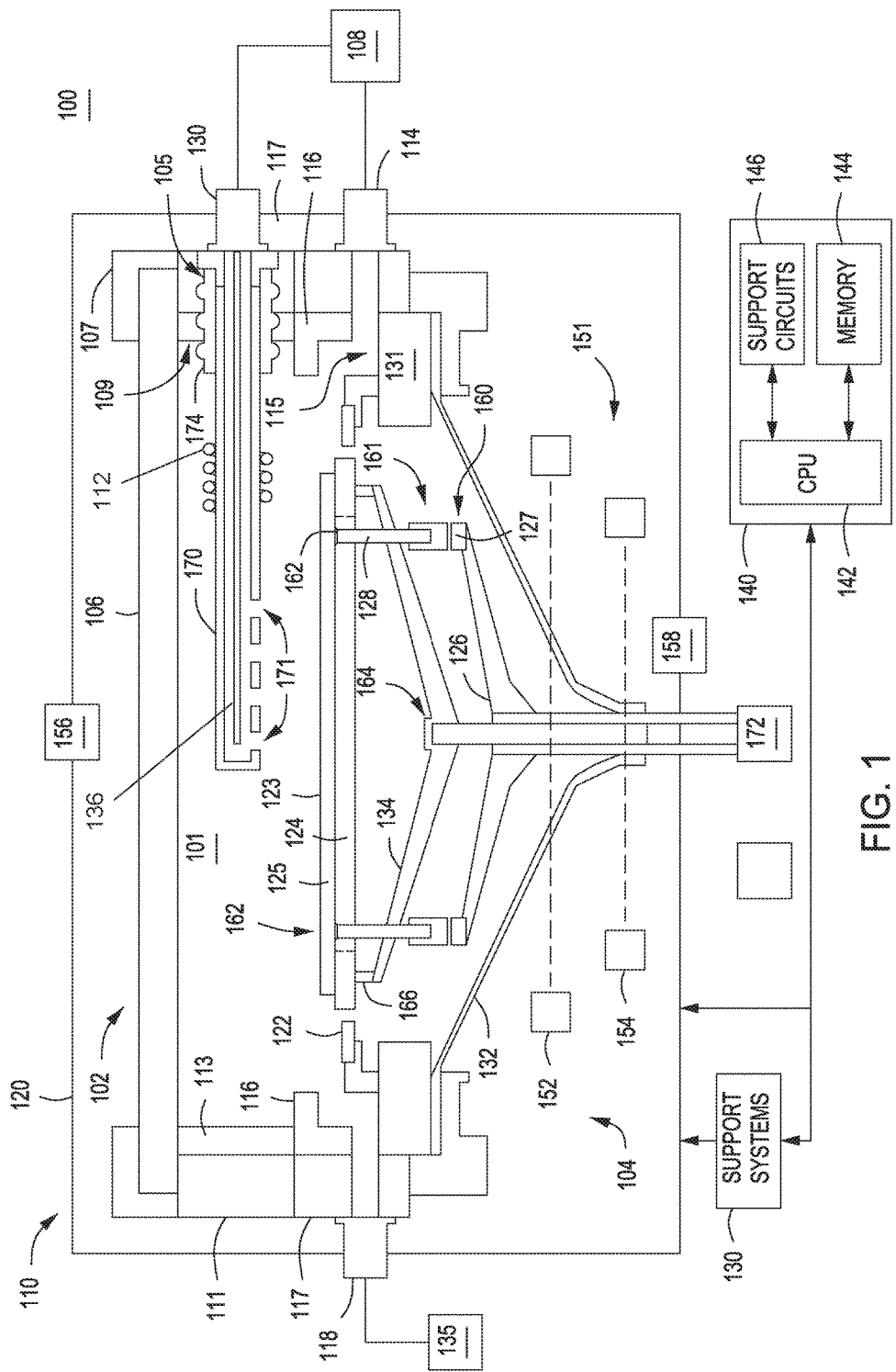
FIG. 1 depicts a schematic side view of a process chamber in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

As used herein, the term "substantially" means that the recited characteristic, parameter, or value need not be achieved exactly, but that deviations or variations, including for example, tolerances, measurement error, measurement accuracy limitations and other factors known to those skilled in the art, may occur in amounts that do not preclude the effect the characteristic is intended to provide.

Methods and apparatus for delivering process gases to a substrate are provided herein. In some non-limiting exemplary embodiments, the methods and apparatus may advantageously be used to uniformly deposit advanced compound thin films, such as those including one or more of III-V materials, silicon germanium (SiGe), silicon carbon (SiC), or germanium tin (GeSn) on a substrate. Other materials may also be advantageously deposited using the methods and apparatus disclosed herein.

FIG. 1 depicts a schematic side view of a process chamber 100 in accordance with some embodiments of the present invention. In some embodiments, the process chamber 100 may be modified from a commercially available process chamber, such as the RP EPI®, reactor, available from Applied Materials, Inc. of Santa Clara, Calif., or any other suitable semiconductor process chamber adapted for performing epitaxial silicon deposition processes. The process chamber 100 may be adapted for performing epitaxial deposition processes, for example as discussed below with respect to the method of FIG. 4, and illustratively comprises a chamber body 110, a processing volume 101, a gas inlet port 114, a gas distribution conduit 170, and an exhaust manifold 118. The process chamber 100 may further include a controller 140, as discussed in more detail below.

The gas inlet port 114 may be disposed at a first side of a substrate support 124 disposed inside the chamber body 110 to provide a process gas across a processing surface 123 of a substrate 125 when the substrate 125 is disposed on the substrate support 124. In some embodiments, a plurality of process gases may be provided from the gas inlet port 114. The plurality of process gases may be provided, for example, from a gas panel 108 coupled to the gas inlet port 114 and the gas distribution conduit 170. The gas inlet port 114 may be coupled to a space 115, as illustrated in FIG. 1, formed by one or more chamber liners of the processing volume 101 to provide a process gas across the processing surface 123 of the substrate 125.

The exhaust manifold 118 may be disposed at a second side of the substrate support 124, opposite the gas inlet port 114, to exhaust the process gases from the process chamber 100. The exhaust manifold 118 may include an opening that is about the same width as the diameter of the substrate 125 or larger. The exhaust manifold 118 may be heated, for example, to reduce deposition of materials on surfaces of the exhaust manifold 118. The exhaust manifold 118 may be coupled to a vacuum apparatus 135, such as vacuum pump, abatement system, or the like to exhaust any process gases exiting the process chamber 100.

The chamber body 110 generally includes an upper portion 102, a lower portion 104, and an enclosure 120. The upper portion 102 is disposed on the lower portion 104 and includes a chamber lid 106, an upper chamber liner 116, and a spacer liner 113. In some embodiments, an upper pyrometer 156 may be provided to provide data regarding the temperature of the processing surface of the substrate during processing. A clamp ring 107 may be disposed atop the chamber lid 106 to secure the chamber lid 106. The chamber lid 106 may have any suitable geometry, such as flat (as illustrated) or having a dome-like shape (not shown), or other shapes, such as reverse curve lids are also contemplated. In some embodiments, the chamber lid 106 may comprise a material, such as quartz or the like. Accordingly, the chamber lid 106 may at least partially reflect energy radiated from the substrate 125 and/or from lamps disposed below the substrate support 124. The gas distribution conduit 170 may comprise a material such as ceramic, quartz, or the like, for example, to at least partially reflect energy as discussed above.

The spacer liner 113 may be disposed above the upper chamber liner 116 and below the chamber lid 106 as depicted in FIG. 1. The spacer liner 113 may be disposed on an inner surface of a spacer ring 111, where the spacer ring 111 is disposed in the chamber body 110 between the chamber lid 106 and a portion 117 of the chamber body 110 coupled to the gas inlet port 114 and the exhaust manifold 118. The spacer ring 111 may be removable and/or interchangeable with existing chamber hardware. For example, the spacer ring 111 including the spacer liner 113 and the gas distribution conduit 170 (and optionally, additional gas distribution conduits) may be retrofit to existing process chambers by inserting the spacer ring 111 between the chamber lid 106 and the portion 117 of the chamber body 110. In some embodiments, the spacer liner 113 may comprise a material, such as quartz or the like. The spacer liner 113 may include a first opening 109, where the gas distribution conduit 170 extends through the first opening 109 in the spacer liner 113 and into the process chamber 100. For example, a corresponding opening 105 may be present in the spacer ring 111 to accept and/or mount the gas distribution conduit 170 thereon and therethrough.

Figure 2A:
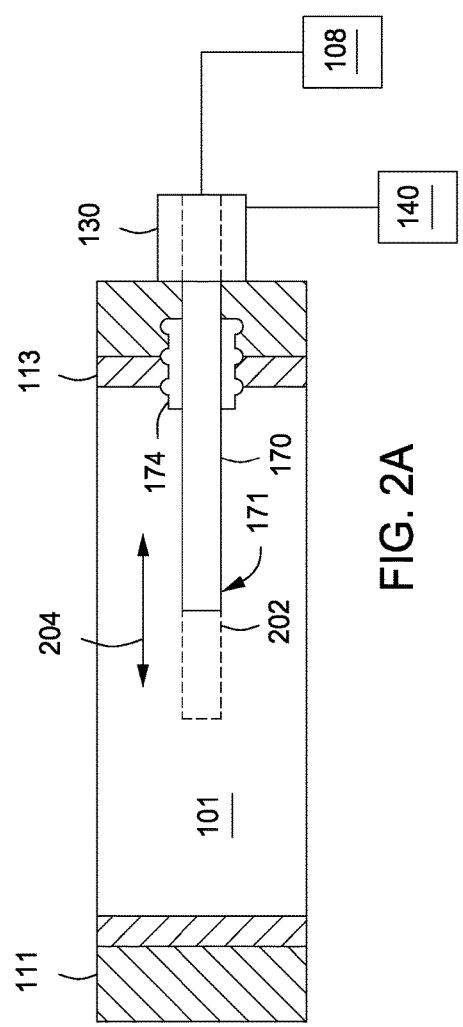
FIGS. 2A-2B depict a schematic side views of a portion of a process chamber in accordance with some embodiments of the present invention.
Figure 2B:
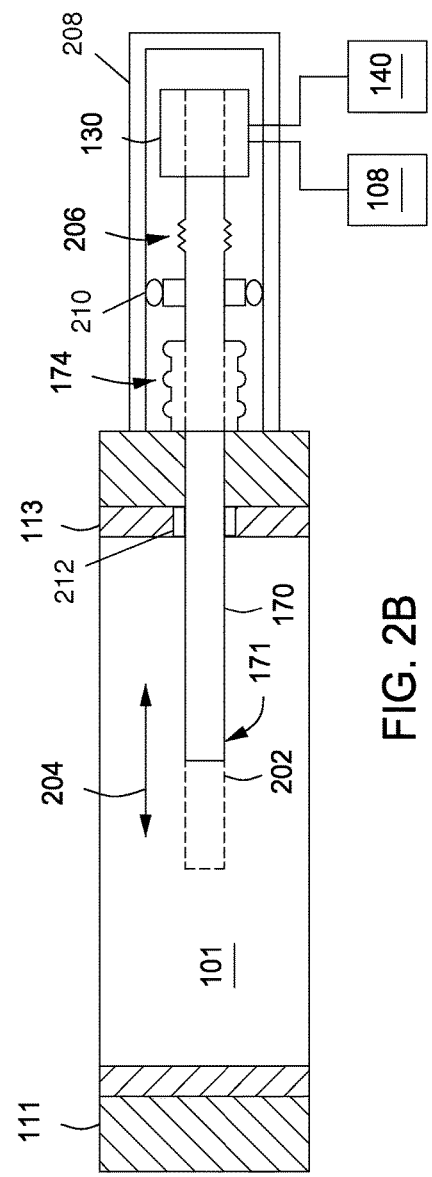

The gas distribution conduit 170 may be disposed above the substrate support 124 (e.g., opposing the substrate support 124) to provide a process gas from the gas panel 108 to the processing surface 123 of the substrate 125. For example, in some embodiments, the gas distribution conduit 170 extends through the spacer liner 113 and into the process chamber 100, as discussed above. In process chambers having other configurations, the gas distribution conduit 170 may also be provided in any appropriate location in such process chambers such that the gas distribution conduit 170 extends into the process volume above the substrate as disclosed herein. In some embodiments, a seal 174 is disposed between the gas distribution conduit 170 and a surface of the process chamber to seal the first opening 109 within the spacer liner 113. In some embodiments, as depicted in FIG. 1 and FIG. 2A, the seal 174 is disposed against an interior surface of the chamber body 110 proximate an opening in the portion 117 of the chamber body 110. In some embodiments, as depicted in FIG. 2B, the seal 174 may be disposed against an exterior surface of the chamber body 110 proximate an opening in the portion 117 of the chamber body 110. Providing the seal on an exterior surface of the chamber body 110 advantageously moves the seal 174 further from the process chamber environment (e.g., further from process gases and high temperatures), which can enhance seal performance and lifetime.

The seal 174 may have any suitable configuration for providing a seal that facilitates rotation and or lateral movement of the gas distribution conduit 170. For example in some embodiments, the seal 174 may be fabricated from a flexible material and may have a bellows configuration to accommodate the movement of the gas distribution conduit 170 with respect to the process chamber 100, as discussed below. Alternatively or in combination, in some embodiments, a seal 212 may be formed using a ferrofluid and a magnetic circuit that facilitates sliding and rotation of the gas distribution conduit 170, such as a FERROFLUIDIC® seal available from FerroTec Corporation (e.g., a ferrofluid seal), or a differentially pumped sliding seal (e.g., a differentially pumped sliding seal that facilitates sliding and rotation of the gas distribution conduit 170). Both seals 174 and 212 are depicted in FIG. 2B.

The gas distribution conduit 170 is movable within the processing volume, relative to the substrate 125. In some embodiments, the gas distribution conduit 170 is coupled to an actuator 130 to move the gas distribution conduit 170 with respect to the substrate 125. The gas distribution conduit 170 may be movable within the processing volume 101 in a variety of ways. For example, FIGS. 2A-2B depict schematic side views of a portion of a process chamber showing the gas distribution conduit 170 in accordance with some embodiments of the present invention. As shown in FIGS. 2A-2B, in some embodiments, the gas distribution conduit 170 is movable in a linear axial direction, as indicated by the dashed lines 202 and arrow 204. For example, the gas distribution conduit 170 may be extended and/or retracted in a linear direction along the elongate central axis of the gas distribution conduit 170. In some embodiments, the gas distribution conduit 170 may be movable such that, over the range of motion, at least some gas distribution holes (e.g., outlets 171, described below) may be selectively disposed over a center of the substrate 125 and at least some gas distribution holes may be selectively disposed over an edge of the substrate 125.

In some embodiments, the range of motion of the gas distribution conduit 170 is up to about one half of the diameter of a substrate to be processed, or in some embodiments, up to about the whole diameter of the substrate, or more. For example, in some embodiments, the range of motion of the gas distribution conduit may be about 5 mm to about 250 mm. In some embodiments, the range of motion of the gas distribution conduit is about 5 mm to about 500 mm. In some embodiments, the available range of motion of the gas distribution conduit 170 may be selected based upon the configuration of the substrate support. For example, in embodiments where the substrate support rotates the substrate, a lesser range of motion may be provided, and in embodiments where the substrate is not rotated, a greater range of motion may be provided.

Figure 3:
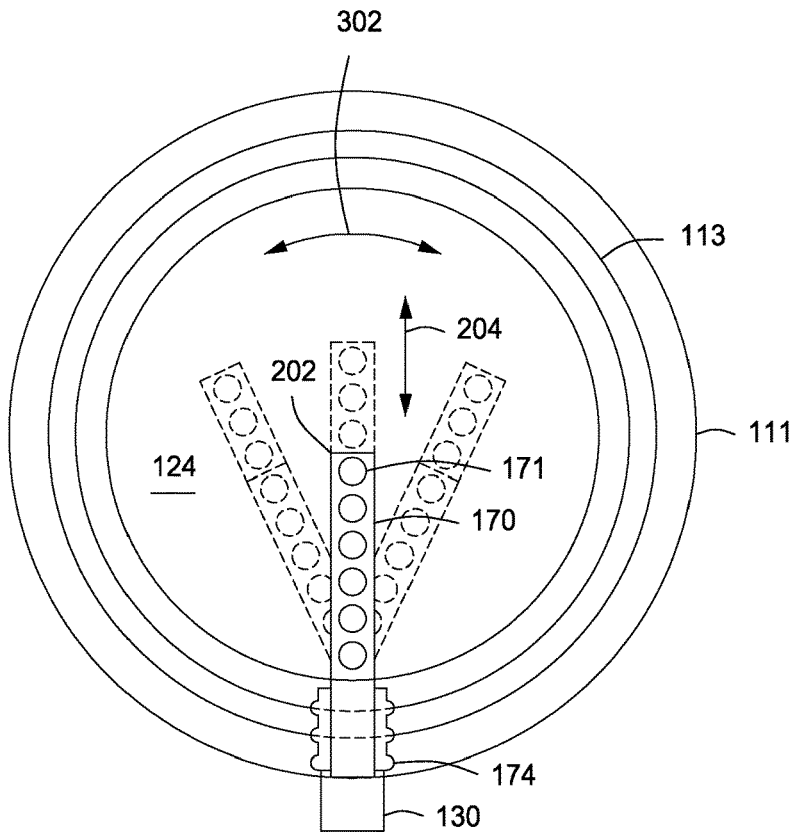
FIG. 3 depicts a partial schematic top view of a process chamber in accordance with some embodiments of the present invention.

Alternatively or in combination with the above-described axial motion, the gas distribution conduit 170 may also be laterally movable in a non-axial direction (e.g., movable from side to side with respect to the elongate central axis). As used herein, motion in a non-axial direction may include axial motion as a component of the motion, as long as non-axial movement is also provided. For example, FIG. 3 depicts a partial schematic top view of a portion of a process chamber having the gas distribution conduit 170 in accordance with some embodiments of the present invention. In some embodiments, as depicted in FIG. 3, the gas distribution conduit 170 is movable in a circular arc 302. For example, the gas distribution conduit 170 may rotate about a pivot axis normal to the axis of the gas distribution conduit 170, wherein the pivot axis passes through a pivot point disposed along the axis of the gas distribution conduit 170. In some embodiments, the gas distribution conduit 170 can move in a circular arc 302 from at least a center of the substrate 125 to an edge of the substrate 125. In some embodiments, the gas distribution conduit 170 can move in a circular arc 302 from at least a first location on the edge of the substrate 125 to a second location on the edge of the substrate 125, for example, by moving from one side of the substrate to the other. The range of motion of the gas distribution conduit 170 may be as discussed above. Alternatively or in combination, the gas distribution conduit 170 may move laterally in non-circular or arc-like movements, such as in a purely side-to-side, in-and-out (e.g., toward and away from the center of the substrate support), or in some other non-rotational motion. In some embodiments, the movement of the gas distribution conduit 170 may be constrained to within a plane that is parallel or substantially parallel to a plane defined by the support surface of the substrate support (e.g., to the plane of the substrate).

In embodiments where both linear and lateral movement are provided, the motions may be alternately provided, or simultaneously provided. For example, in some embodiments, the gas distribution conduit 170 may extend linearly in the axial direction (e.g., dashed lines 202) followed by movement along the circular arc 302. In some embodiments, the gas distribution conduit 170 is retracted linearly in the axial direction (e.g., dashed lines 202) followed by movement along the circular arc 302. In some embodiments, the gas distribution conduit 170 is moved simultaneously in the linear axial direction (e.g., arrow 204) and along the circular arc 302. The motion of the gas distribution conduit 170 as described above allows for optimal exposure of the processing surface 123 of the substrate 125 to the process gas to more accurately control deposition uniformity and/or composition and to minimize residue formation on the processing surface 123.

In some embodiments, as depicted in FIG. 2B, a portion of the gas distribution conduit 170 extending through the seal 174 includes a flexible portion 206 to further facilitate the above-described rotation and or lateral movement of the gas distribution conduit 170. In some embodiments, and as also depicted in FIG. 2B, additional components may be provided for additional support of the gas distribution conduit 170. For example, the gas distribution conduit 170 may be disposed within a housing 208 to contain and support the gas distribution conduit 170. In some embodiments, the housing 208 may enclose the actuator 130 (as shown), or the actuator 130 may be disposed outside of the housing. One or more elements may be provided to reduce friction of movement of the gas distribution conduit 170 while supporting the gas distribution conduit 170. For example, a low-friction coating, a bushing, a bearing, or the like, or combinations thereof may be provided (bearing 210 shown) to reduce friction of movement of the gas distribution conduit 170 while providing support.

In some embodiments, the gas distribution conduit 170 may be a substantially linear member, although other shapes may be used. The gas distribution conduit 170 is advantageously relatively small, for example, as compared to a large circular element that covers substantially the entire substrate (e.g., a conventional showerhead), thereby facilitating ease of manufacture, reduced cost, and the like.

The gas distribution conduit 170 may include one or more outlets 171 disposed along the length of the gas distribution conduit 170 to provide a process gas to the processing surface 123 of the substrate 125. For example, in some exemplary, non-limiting embodiments, the process gas provided by the gas distribution conduit may be silane, dichlorosilane, trichlorosilane, tetrachlorosilane, germane, phosphine, borane, diborane, arsine, trimethyl aluminum, trimethyl gallium, or the like, although other process gases may be provided as required for a particular process. The one or more outlets 171 may be substantially linearly arranged, as illustrated in FIGS. 1, 2 and 3. As used herein, the term "substantially linearly arranged" may be taken to mean "linear" or "approximately linear". In some embodiments, the outlets 171 may be non-linearly arranged.

Each outlet 171 may have any desired diameter to control the provision of the gas, for example, at a desired overall flow rate, a desired flow velocity, or the like. The respective diameters of each outlet 171 may be the same or may be different. For example, an outlet 171 proximate a center of the substrate support 124 may have a different diameter than that of any other outlet 171, for example, a outlet 171 located proximate an edge of the substrate support 124, such as to provide approximately the same and/or any desired flow velocity, mass flow rate, or the like, at each location.

Alternatively, or in combination, the inner volume of the gas distribution conduit 170 may have any desired shape (e.g., cross-section and shape along the length of the conduit) in addition to the tubular shape illustrated in FIGS. 1, 2, and 3. For example, the shape of the inner volume of the gas distribution conduit 170 may be controlled to provide the same and/or any desired flow rate at each respective outlet 171 along the length of the gas distribution conduit 170. For example, the inner diameter of the gas distribution conduit 170 may be varied to control pressure and flow rate at each respective outlet 171 along the length of the gas distribution conduit 170. For example, the gas distribution conduit 170 may have a varying cross-section along the length of the conduit, such as a larger diameter cross-section proximate the edge of the substrate support 124 and a smaller diameter cross section proximate the center of the substrate support 124 to provide a similar flow rate at outlets 171 at each location. Similarly, other suitable shapes of the gas distribution conduit 170 may be used to manipulate the flow rate at each outlet 171 along the length of the gas distribution conduit 170, for example, such as varying wall thickness to vary the pressure drop across each outlet 171, or the like.

As illustrated in FIG. 3, the position of the one or more outlets 171 along the length of the gas distribution conduit 170 may vary. The position of the outlets 171 along with the movement of the gas distribution conduit 170 may advantageously provide the process gas to one or more desired regions of the substrate 125. For example, as illustrated in FIG. 3, the one or more outlets 171 of the gas distribution conduit 170 may be a plurality of outlets that extend along the length of the gas distribution conduit 170 from about the center of the substrate support 124 to about the edge of the substrate support 124.

In some embodiments, a plurality of gas distribution conduits as described above may be disposed above the substrate 125. Each gas distribution conduit in the plurality of gas distribution conduits may be coupled to corresponding actuators to control the position and movement of the respective gas distribution conduits with respect to the substrate as described above.

In some embodiments, one or more techniques may be used to actively and/or passively control the temperature of the gas flowing through the gas distribution conduit 170. For example, the gas distribution conduit 170 may be fabricated from materials that absorb energy from other energy sources disposed within the chamber (e.g., lamps 152, 154, the substrate support 124, or the substrate 125, when heated) to passively control the gas temperature within the gas distribution conduit 170. Alternatively or in combination, one or more heat coils 112 may be provided within or around the walls of the gas distribution conduit 170, and/or the gas distribution conduit 170 may be configured as a hollow Dewar tube or conduit (e.g., to thermally insulate the interior of the gas distribution conduit 170 from the exterior environment), and/or the gas distribution conduit 170 may be fabricated from materials having a high thermal conductivity (e.g., from about 10 W/m/K to about 400 W/m/K) and may be coupled to a heat sink (such as a portion of the chamber body 110), and/or a heat pipe 136 may be provided within the gas distribution conduit 170. Providing such control over the temperature of the gas flowing through the gas distribution conduit 170 advantageously facilitates more efficient processing with precursors (e.g., process gases) having different preheat requirements.

Returning to FIG. 1, the upper chamber liner 116 may be disposed above the gas inlet port 114 and the exhaust manifold 118 and below the chamber lid 106, as depicted. In some embodiments, the upper chamber liner 116 may comprises a material, such as quartz or the like, for example, to at least partially reflect energy as discussed above. In some embodiments, the upper chamber liner 116, the chamber lid 106, and a lower chamber liner 131 (discussed below) may be quartz, thereby advantageously providing a quartz envelope surrounding the substrate 125.

The lower portion 104 generally comprises a baseplate assembly 119, a lower chamber liner 131, a lower dome 132, the substrate support 124, a pre-heat ring 122, a substrate lift assembly 160, a substrate support assembly 164, a heating system 151, and a lower pyrometer 158. The heating system 151 may be disposed below the substrate support 124 to provide heat energy to the substrate support 124 as illustrated in FIG. 1. The heating system 151 may comprise one or more outer lamps 152 and one or more inner lamps 154. Alternatively or in combination, the heating system 151 may be disposed above the substrate support 124. Alternatively or in combination, the heating system 151 may include one or more of a hot plate (e.g., the substrate support 124 may include one or more resistive heating elements coupled to a power supply for heating the substrate support 124), a microwave energy source, a laser source, a diode, an induction heating apparatus, or the like, to heat the substrate support 124 or the substrate directly.

Although the term "ring" is used to describe certain components of the process chamber, such as the pre-heat ring 122, it is contemplated that the shape of these components need not be circular and may include any shape, including but not limited to, rectangles, polygons, ovals, and the like. The lower chamber liner 131 may be disposed below the gas inlet port 114 and the exhaust manifold 118, for example, and above the baseplate assembly 119. The gas inlet port 114 and the exhaust manifold 118 are generally disposed between the upper portion 102 and the lower portion 104 and may be coupled to either or both of the upper portion 102 and the lower portion 104.

As illustrated in FIG. 1, the gas inlet port 114 and exhaust manifold 118 may be coupled to the processing volume 101 via respective openings in the portion 117 of the chamber body 110. For example, in some embodiments, the space 115 may be at least partially formed by the upper and lower chamber liners 116, 131 on the first side of the substrate support 124. The gas inlet port 114 may be fluidly coupled to the processing volume 101 via the space 115.

The substrate support 124 may be any suitable substrate support, such as a plate (illustrated in FIG. 1) or ring (illustrated by dotted lines in FIG. 1) to support the substrate 125 thereon. The substrate support assembly 164 generally includes a support bracket 134 having a plurality of support pins 166 to couple the support bracket 134 to the substrate support 124. The substrate lift assembly 160 comprises a substrate lift shaft 126 and a plurality of lift pin modules 161 selectively resting on respective pads 127 of the substrate lift shaft 126. In one embodiment, a lift pin module 161 comprises an optional upper portion of the lift pin 128 that is movably disposed through a first opening 162 in the substrate support 124. In operation, the substrate lift shaft 126 is moved to engage the lift pins 128. When engaged, the lift pins 128 may raise the substrate 125 above the substrate support 124 or lower the substrate 125 onto the substrate support 124.

The substrate support 124 may further include a lift mechanism 172 coupled to the substrate support assembly 164. The lift mechanism 172 can be utilized to move the substrate support 124 in a direction perpendicular to the processing surface 123 of the substrate 125. For example, the lift mechanism 172 may be used to position the substrate support 124 relative to the gas distribution conduit 170 and the gas inlet port 114. In operation, the lift mechanism may facilitate dynamic control of the position of the substrate 125 with respect to the flow field created by the gas inlet port 114 and/or the gas distribution conduit 170. Dynamic control of the substrate 125 position in combination with movement of the gas distribution conduit 170 with respect to the substrate may be used to optimize exposure of the processing surface 123 of the substrate 125 to the flow field to optimize deposition uniformity and/or composition and minimize residue formation on the processing surface 123. In some embodiments, the lift mechanism 172 may be configured to rotate the substrate support 124 about a central axis of the substrate support 124. Alternatively, a separate rotation mechanism may be provided.

During processing, the substrate 125 is disposed on the substrate support 124. The lamps 152, 154 are sources of infrared (IR) radiation (i.e., heat) and, in operation, generate a pre-determined temperature distribution across the substrate 125. The chamber lid 106, the upper chamber liner 116, and the lower dome 132 may be formed from quartz as discussed above; however, other IR-transparent and process compatible materials may also be used to form these components. The lamps 152, 154 may be part of a multi-zone lamp heating apparatus to provide thermal uniformity to the backside of the substrate support 124. For example, the heating system 151 may include a plurality of heating zones, where each heating zone includes a plurality of lamps. For example, the one or more lamps 152 may be a first heating zone and the one or more lamps 154 may be a second heating zone. The lamps 152, 154 may provide a wide thermal range of about 200 to about 900 degrees Celsius on the processing surface 123 of the substrate 125. The lamps 152, 154 may provide a fast response control of about 5 to about 20 degrees Celsius per second on the processing surface 123 of the substrate 125, when disposed on the substrate support 124. In some embodiments, where the substrate is supported, for example, by edge rings or by pins, the heating rates could be about 200 degrees Celsius per second on the processing surface 123. For example, the thermal range and fast response control of the lamps 152, 154 may provide deposition uniformity on the substrate 125. Further, the lower dome 132 may be temperature controlled, for example, by active cooling, window design or the like, to further aid control of thermal uniformity on the backside of the substrate support 124, and/or on the processing surface 123 of the substrate 125.

The processing volume 101 may be formed or defined by a plurality of chamber components. For example, such chamber components may include one or more of the chamber lid 106, the spacer liner 113, the upper chamber liner 116, the lower chamber liner 131, and the substrate support 124. The processing volume 101 may include interior surfaces comprising quartz, such as the surfaces of any one or more of the chamber components that form the processing volume 101. In some embodiments, other materials compatible with the processing environment may be used, such as silicon carbide (SiC) or SiC coated graphite for the substrate support 124. The processing volume 101 may be about 20 to about 40 liters. The processing volume 101 may accommodate any suitably sized substrate, for example, such as 200 mm, 300 mm or the like. For example, in some embodiments, if the substrate 125 is about 300 mm, then the interior surfaces, for example of the upper and lower chamber liners 116, 131 may be, in a non-limiting example, about 50 mm to about 70 mm away from the edge of the substrate 125. For example, in some embodiments, the processing surface 123 of the substrate 125 may be disposed at up to about 100 millimeters, or about 10 mm to about 25 mm from the chamber lid 106.

The processing volume 101 may have a varying volume, for example, the size of the processing volume 101 may shrink when the lift mechanism 172 raises the substrate support 124 closer to the chamber lid 106 and expand when the lift mechanism 172 lowers the substrate support 124 away from the chamber lid 106. The processing volume 101 may be cooled by one or more active or passive cooling components. For example, the processing volume 101 may be passively cooled by the walls of the process chamber 100, which for example, may be stainless steel or the like. For example, either separately or in combination with passive cooling, the processing volume 101 may be actively cooled, for example, by flowing a coolant about the process chamber 100. For example, the coolant may be a gas or fluid.

The controller 140 may be coupled to various components of the process chamber 100 to control the operation thereof—for example, including the gas panel 108 and the actuator 130. The controller 140 includes a central processing unit (CPU) 142, a memory 144, and support circuits 146. The controller 140 may control the process chamber 100 and various components thereof, such as the actuator 130, directly (as shown in FIG. 1) or, alternatively, via computers (or controllers) associated with the process chamber. The controller 140 may be one of any form of general-purpose computer processor that can be used in an industrial setting for controlling various chambers and sub-processors. The memory, or computer-readable medium, 144 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 146 are coupled to the CPU 142 for supporting the processor in a conventional manner. These circuits include cache, power supplies, clock circuits, input/output circuitry and subsystems, and the like. Inventive methods as described herein may be stored in the memory 144 as software routine that may be executed or invoked to control the operation of the process chamber 100 in the manner described herein. The software routine may also be stored and/or executed by a second CPU (not shown) that is remotely located from the hardware being controlled by the CPU 142.

Figure 4:
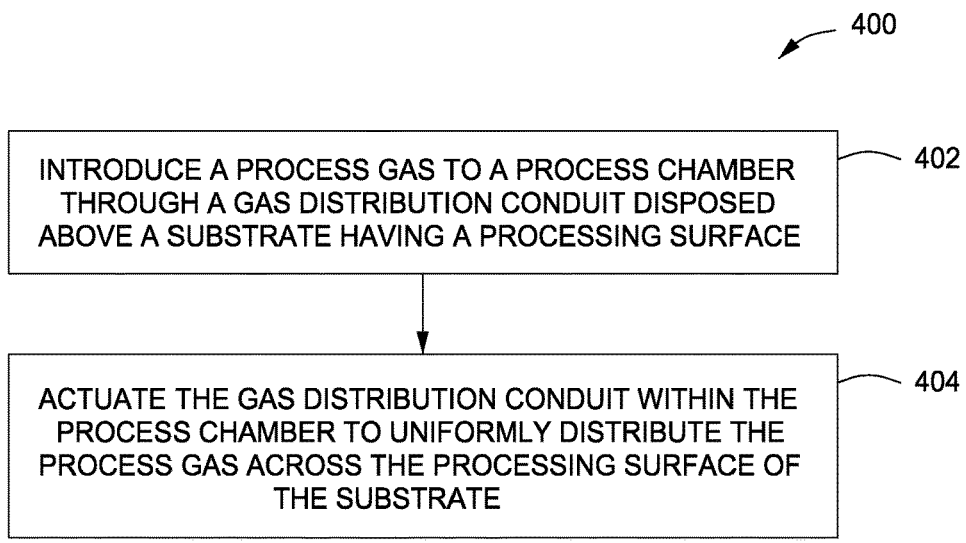
FIG. 4 depicts a flow chart of method for depositing a layer on a substrate in accordance with some embodiments of the present invention.

FIG. 4 depicts a flow chart for a method 400 of processing a substrate in accordance with embodiments of the invention. The method 400 is described below in accordance with embodiments of the process chamber 100. However, the method 400 may be used in any suitable process chamber capable of performing the elements of the method 400 and is not limited to the process chamber 100.

The method 400 begins at 402, by flowing the process gas towards the processing surface 123 of the substrate 125. The process gas may be flowed from the gas distribution conduit 170 using any suitable embodiment of the first gas distribution conduit 170 as discussed above. Next at 404, the gas distribution conduit 170 is moved within the process chamber to distribute the process gas across the processing surface 123 of the substrate 125 to form one or more layers on the processing surface 123 of the substrate 125. The gas distribution conduit 170 may be moved as described above. In some embodiments, the temperature of the processing surface 123 of the substrate 125 may be controlled while forming the one or more layers on the processing surface 123 of the substrate 125. For example, controlling the temperature may include heating and/or cooling the temperature-controlled processing volume 101, such as heating and/or cooling any one or more of the components and/or interior surfaces making up the processing volume 101. For example, heating may include providing energy to a backside surface of the substrate support 124, wherein the substrate rest on the frontside surface of the substrate support 124. Heating may be provided prior and/or during flow of process gases. Heating may be continuous or discontinuous, and in any desired scheme, such as periodic or the like. Heating may provide any desired temperature profile to the substrate 125 prior to and/or during the flow of the process gases to achieve deposition on the processing surface 123. Heating may be provided by the lamps 152, 154. The lamps 152, 154 may be capable of increasing the substrate temperature from about 5 degrees Celsius per second to about 20 degrees Celsius per second on the processing surface 123 of the substrate 125. The lamps 152, 154 may be capable of providing a temperature to the processing surface 123 of the substrate 125 ranging from about 200 to about 900 degrees Celsius.

Thus, improved methods and apparatus for delivering process gases to a substrate in a processing chamber have been shown and described herein. Embodiments of the inventive methods and apparatus may advantageously provide for uniform and or otherwise controlled deposition of films upon a substrate in a processing chamber.

While the foregoing is directed to embodiments of the present invention, other and further embodiments of the invention may be devised without departing from the basic scope thereof.

The invention claimed is:

1. An apparatus for processing a substrate, comprising:
   a substantially linear gas distribution conduit disposed in a processing volume of a process chamber above a substrate support to distribute a process gas to a processing surface of the substrate when disposed on the substrate support, wherein the gas distribution conduit has a plurality of outlets linearly arranged along a linear axis of the gas distribution conduit to provide the process gas to the substrate; and
   an actuator coupled to the gas distribution conduit to move the gas distribution conduit with respect to the substrate support, wherein the gas distribution conduit is rotatable about a pivot axis normal to the linear axis of the gas distribution conduit, and wherein the pivot axis passes through a pivot point disposed along the linear axis of the gas distribution conduit.

2. The apparatus of claim 1, wherein the actuator moves the gas distribution conduit in at least one of a linear axial direction or in a lateral, non-axial direction with respect to the substrate support.

3. The apparatus of claim 1, further comprising:
   a seal disposed between the gas distribution conduit and a surface of the process chamber to seal an opening in the process chamber through which the gas distribution conduit is disposed, the seal forming a seal between the processing volume of the process chamber and the opening in the process chamber.

4. The apparatus of claim 3, wherein the seal is at least one of a flexible material, a bellows, a ferrofluid seal, or a differentially pumped sliding seal.

5. The apparatus of claim 1, wherein the gas distribution conduit is made of quartz.

6. The apparatus of claim 1, further comprising a controller coupled to the actuator and configured to control movement of the gas distribution conduit.

7. The apparatus of claim 1, further comprising a heating element disposed within or around the gas distribution conduit.

8. The apparatus of claim 1, wherein the gas distribution conduit is fabricated as a Dewar tube to thermally insulate an interior of the gas distribution conduit from an exterior environment.

9. An apparatus for processing a substrate, comprising:
   a process chamber having a substrate support;
   a heating system to provide heat energy to a substrate when disposed on the substrate support;
   a gas inlet port disposed at a first side of the substrate support to provide a first process gas across a processing surface of a substrate when disposed on the substrate support;
   a gas distribution conduit disposed in a processing volume of the process chamber above a substrate support to distribute a second process gas to a processing surface of the substrate when disposed on the substrate support;
   an actuator coupled to the gas distribution conduit to move the gas distribution conduit with respect to the substrate support, wherein the gas distribution conduit is rotatable about a pivot axis normal to a linear axis of the gas distribution conduit, and wherein the pivot axis passes through a pivot point disposed along the linear axis of the gas distribution conduit; and
   an exhaust manifold disposed to a second side of the substrate support opposite the gas inlet port to exhaust the first process gas and the second process gas from the process chamber.

10. The apparatus of claim 9, wherein the actuator moves the gas distribution conduit in at least one of a linear axial direction or in a lateral, non-axial direction with respect to the substrate support.

11. The apparatus of claim 9, further comprising a seal coupled between the gas distribution conduit and a surface of the process chamber to seal an opening in the process chamber through which the gas distribution conduit is disposed, the seal forming a seal between the processing volume of the process chamber and the opening in the process chamber.

12. The apparatus of claim 9, wherein the gas distribution conduit is disposed in and is constrained to move only in a plane that is substantially parallel to a plane defined by the substrate support.

13. The apparatus of claim 9, wherein the gas distribution conduit includes one or more of:
   a heating element disposed within or around the gas distribution conduit;
   a heat pipe disposed within the gas distribution conduit;
   wherein the gas distribution conduit is fabricated as a Dewar tube to thermally insulate an interior of the gas distribution conduit from an exterior environment;
   wherein the gas distribution conduit is fabricated from materials that absorb energy from other energy sources disposed within the chamber to passively control a temperature of the second process gas; or
   wherein the gas distribution conduit is fabricated from materials having a high thermal conductivity and is coupled to a heat sink.

14. The apparatus of claim 1, wherein the gas distribution conduit is tubular.

15. The apparatus of claim 1, wherein the gas distribution conduit is smaller than a support surface of the substrate support.

16. The apparatus of claim 9, wherein the gas distribution conduit is smaller than a support surface of the substrate support.

17. The apparatus of claim 9, wherein the gas distribution conduit is configured to move only above a portion of the substrate support corresponding to the size of the substrate to be supported.

18. An apparatus for processing a substrate, comprising:
   a substantially linear gas distribution conduit disposed above a substrate support in a processing volume of a process chamber to distribute a process gas to a processing surface of the substrate when disposed on the substrate support; and an actuator coupled to the gas distribution conduit and configured to move the gas distribution conduit with respect to the substrate support while the process gas is flowing through the gas distribution conduit.

19. The apparatus of claim 1, wherein the gas distribution conduit is configured to move only above a portion of the substrate support corresponding to the size of the substrate to be supported.

* * * * *